March 8, 1966 R. N. TABER 3,239,770

COMPLEMENTARY HIGH FREQUENCY AMPLIFIER INCLUDING MULTIPLE FEEDBACK PATHS

Filed March 11, 1963 2 Sheets-Sheet 1

INVENTOR.
ROBERT N. TABER

BY Jeremy E. Olson

ATTORNEY

March 8, 1966 R. N. TABER 3,239,770

COMPLEMENTARY HIGH FREQUENCY AMPLIFIER INCLUDING MULTIPLE FEEDBACK PATHS

Filed March 11, 1963 2 Sheets-Sheet 2

INVENTOR.
ROBERT N. TABER

BY Spencer E. Olson

ATTORNEY

United States Patent Office 3,239,770

Patented Mar. 8, 1966

3,239,770

COMPLEMENTARY HIGH FREQUENCY AMPLIFIER INCLUDING MULTIPLE FEEDBACK PATHS

Robert N. Taber, Belmont, Mass., assignor to Sylvania Electric Products Inc., a corporation of Delaware Filed Mar. 11, 1963, Ser. No. 264,158
7 Claims. (Cl. 330—15)

The present invention relates to electronic circuits and more particularly to semiconductor wideband high frequency amplifiers.

Wideband high frequency amplifiers have innumerable applications in electronic systems. For example, in multicouplers used in RF distribution systems, the amplifiers must be capable of amplifying signals over a wide frequency range with a minimum of interference between channels. Heretofore, many circuits have evolved which provide wideband operation; however, in doing so other characteristics such as dynamic range, distortion, noise figure, and gain and phase tracking have been sacrificed, thus making the amplifier unsuitable for many purposes, such as in the multicoupler just mentioned. Accordingly, it is a primary object of the present invention to provide a wideband high frequency amplifier having improved performance characteristics.

Another object of the present invention is to provide an amplifier having increased dynamic range.

Another object of the invention is to provide an amplifier having improved linearity.

Still another object of the invention is to provide an amplifier having low distortion.

A further object of the invention is to provide an amplifier having a low noise figure.

Briefly, the invention in its broadest aspect consists of a pair of complementary transistors which are high frequency compensated to provide broadband operation, and which have multiple feedback to improve linearity and reduce distortion. An amplifier constructed in accordance with the invention is capable of bandwidths of the order of 130 megacycles, with distortion and noise levels lower than or comparable to known amplifiers. Furthermore, the present circuit has a dynamic range which has hitherto been unattainable in amplifiers having the other requisite performance characteristics.

The foregoing, together with other objects, features and advantages of the invention will be better understood from the following detailed description, taken in conjunction with the drawings in which.

Figure 1:
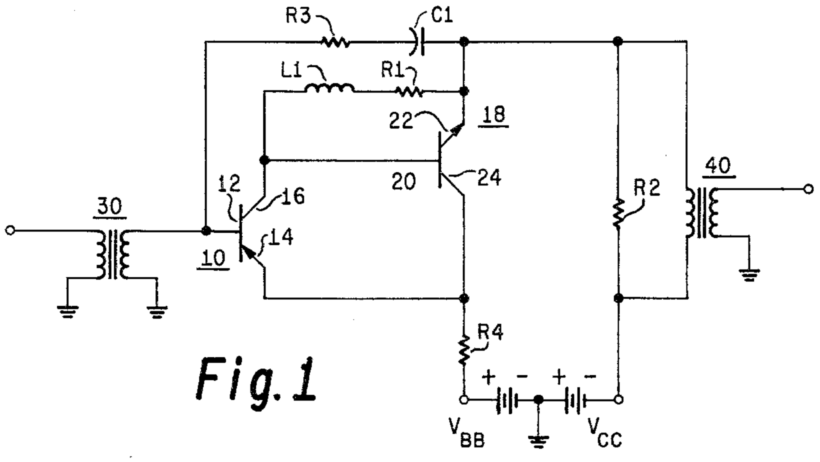
FIG. 1 is a schematic diagram of a high frequency amplifier constructed in accordance with the invention.

In the circuit illustrated in FIG. 1, there is shown a complementary transistor pair consisting of a PNP transistor 10 and NPN transistor 18. The collector 16 and the emitter 14 of transistor 10 are connected respectively to the base 20 and the collector 24 of transistor 18. A series network consisting of a resistor R1 and an inductor L1 is connected between collector 16 and emitter 22. High gain is provided by the two transistor combination, while high frequency operation is provided by the high frequency compensating action of inductor L1, and also by the short interconnections between the two transistors made possible by the complementary nature of the transistors. Awkward bias arrangements, which would be necessary if non-complementary transistors were used, are eliminated, thus permitting the relatively simple circuit shown in FIG. 1. The transistors can be of any standard type having the requisite performance characteristics so that linear operation is attainable without oscillation and with low noise.

It will be appreciated that the circuit can also be constructed with the transistors in reverse order to that shown in FIG. 1. That is, transistor 10 can be of the NPN type while transistor 18 can be of the PNP type, with corresponding changes in the polarity of the operating potentials. It is desirable to keep the interconnections between the transistors, as well as all path lengths, as short as possible in order to provide stable high frequency operation. Extremely short interconnections could be provided by utilizing a pair of complementary transistors which are packaged in a single unit. The interconnections between the two transistors could be made during fabrication of the device; therefore, the composite transistor thus formed would have only three external leads which are connected to the external circuitry. Resistor R1 acts as a shunt to the two transistor combination thereby maintaining the low frequency gain at essentially the same gain as a single transistor. Inductor L1 provides frequency compensation by increasing the impedance of the series network at higher frequencies, thus maintaining the gain over an extended frequency range, as is well known.

A feedback path consisting of a resistor R3 and a capacitor C1 is connected between the emitter 22 and the base 12. A second feedback path is provided by a resistor R4 connected between the junction of collector 24 and emitter 14 and a source of suitable positive operating potential $V_{BB}$. Voltage feedback provided by the R3–C1 network improves the linearity of the amplifier and also provides input impedance matching. Current feedback provided by resistor R4 additionally improves the linearity of the amplifier. Decoupling between emitter 22 and base 12 is provided by capacitor C1. In operation, an input signal is coupled to the base 12 of transistor 10 through a coupling transformer 30. An output signal is obtained via coupling transformer 40, the primary of which is connected across a load resistor R2 which is connected between emitter 22 and a suitable source of negative operating potential $V_{CC}$.

The amplifier is capable of amplifying large input signals due to the degenerating action of resistor R4. The input signal appears between base 12 of transistor 10 and ground, and because of the low source impedance, a substantial portion of the signal voltage appears across resistor R4. Only a fraction of the total input voltage therefore appears across the base to emitter junction of transistor 10. Input voltages up to approximately eight-tenths of a volt can be applied without overdriving the circuit.

The sum of the currents through transistors 10 and 18 is determined by the voltage $V_{BB}$ and the magnitude of resistor R4, while the voltage across the transistors is determined by the voltage $V_{CC}$. The current through the transistors and the voltage across them are dependent upon separate supply voltages and are, therefore, independently adjustable. While other bias schemes can be used in the circuit, the particular arrangement shown is advantageous in that the voltage and current relations in the two transistors can be easily adjusted to provide optimum performance. The current through transistor 10 should be maintained at a low level such that the intermodulation distortion is reduced while not seriously affecting the noise figure.

A feature of the invention that is particularly useful is that the A.C. parameters of the circuit are determined solely by the values of resistors R2, R3, and R4, provided the impedance levels are reasonably low to prevent oscillation. Furthermore, the input impedance is determined mainly by the circuit gain, and the value of the feedback resistor R3. The input impedance $Z_i$, the output impedance $Z_o$ and the gain A are given by the following equations.

$$Z_i=\frac{R3}{1+A} \quad \text{Eq. 1}$$

$$Z_o=\frac{R2R4(R3+Z_i)}{R4(R2+R3+Z_i)+R2Z_i} \quad \text{Eq. 2}$$

$$A=\frac{R2(R3-R4)Z_o}{R4(R2R3+R3Z_o+R2Z_o)} \quad \text{Eq. 3}$$

It is evident from the equations that once the impedance levels and gain are specified, all component values can be determined. Particular values of components used in a circuit will depend, of course, upon the performance characteristics required.

Figure 2:
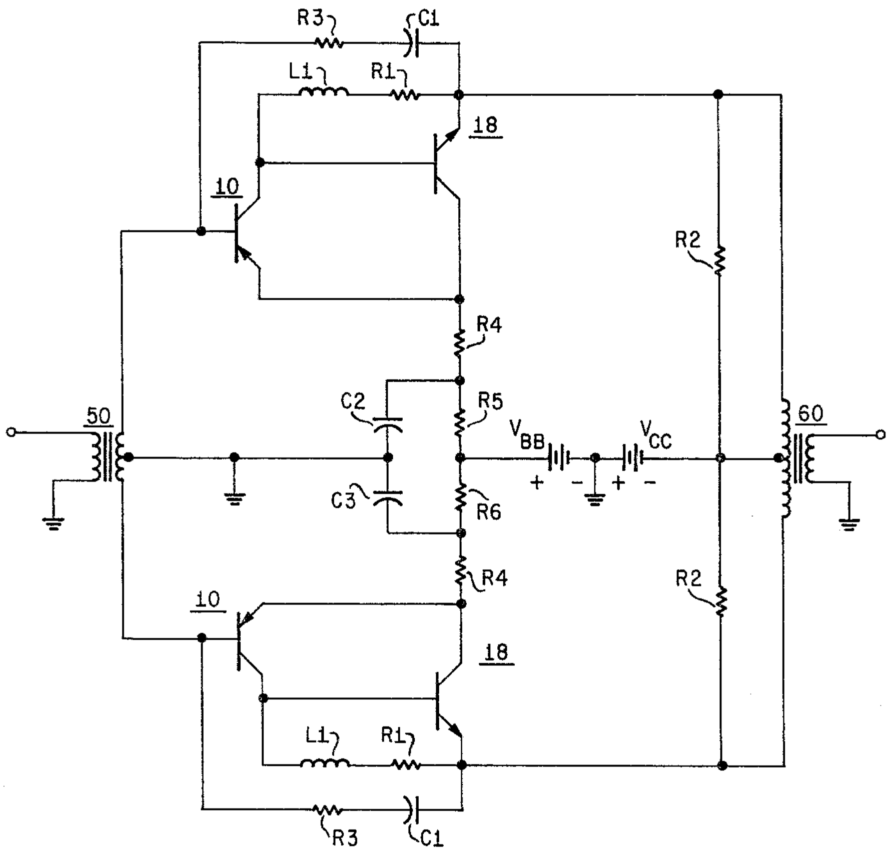
FIG. 2 is a schematic diagram of a push-pull amplifier embodying the invention.

Another embodiment of the invention consisting of a push-pull amplifier is illustrated in FIG. 2. Each channel of the amplifier is identical to the circuit of FIG. 1, except that the usual center tapped input and output transformers 50 and 60 are provided. In addition, resistors R5 and R6 are provided to maintain suitable D.C. balance between the symmetrical channels of the amplifier. Capacitors C2 and C3 bypass RF energy to ground in the conventional manner. The push-pull circuit has the inherent quality of providing lower distortion than a signal channel amplifier since even order distortion products are cancelled by the balanced operation of the circuit. This circuit also provides increased power capacity as would be expected.

A push-pull circuit having a power gain of 12 db that has been constructed and successfully operated has the following component values:

| | |
|---|---|
| R1 | 75 ohms. |
| R2, R3 | 574 ohms. |
| R4 | 20.5 ohms. |
| R5, R6 | 180 ohms. |
| C1, C2, C3 | 0.1 microfarad. |
| L1 | 15 microhenries. |
| Transistor **10** | 2N1142. |
| Transistor **18** | 2N744. |
| Transformer **50** | Turns ratio 1:2, center tapped secondary. |
| Transformer **60** | Turns ratio $\sqrt{2}$:1, center tapped primary. |

The transformers have a linear operating frequency range of 150 kc. to 150 mc. The operating potentials $V_{BB}$ and $V_{CC}$ are +15 volts and −9 volts, respectively. These particular bias voltages produce a current of approximately ten milliamperes through transistor 10, and approximately sixty-five milliamperes through transistor 18. The circuit is extremely economical, consuming only about three and one-half watts of power.

Figure 3:
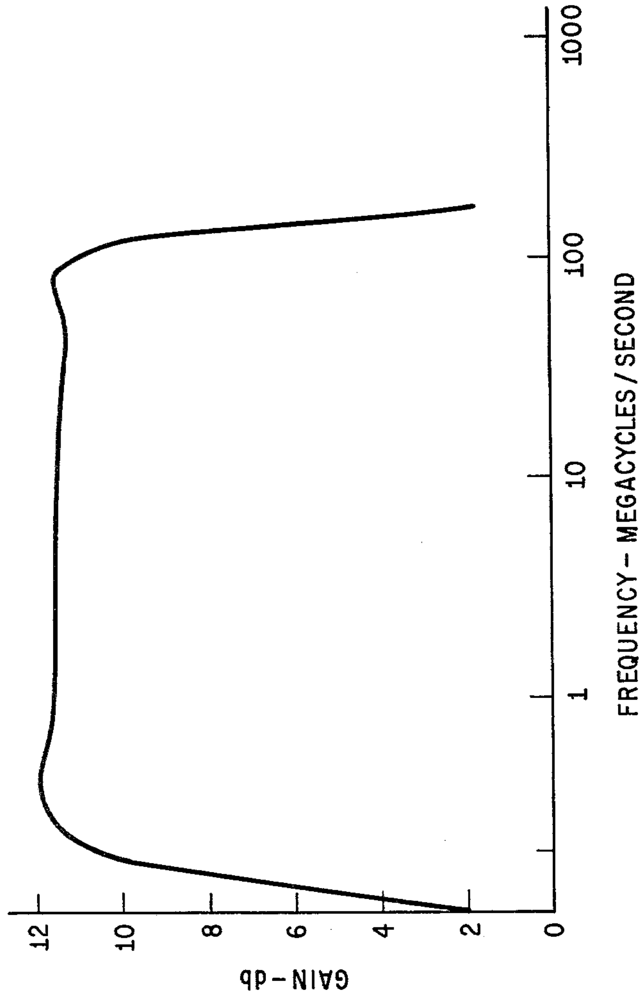
FIG. 3 is a semi-log plot of the frequency response of an amplifier of the type illustrated in FIG. 2.

The frequency response of the amplifier is shown by the measured frequency characteristic illustrated in FIG. 3. It is evident from the curve that the three db bandwidth is from approximately 170 kc. to 130 mc. The average intermodulation distortion level and average noise figure, measured over a passband from 2 to 32 mc. are −70 db and 7 db, respectively. The dynamic range is extended considerably over presently known amplifiers having the same performance. A maximum input signal amplitude of 0.8 volt can be applied without overdriving the amplifier. In addition, the extremely wide bandwidth of the amplifier, and also of the coupling transformers, allows the circuit to have excellent gain and phase tracking characteristics. A minimum phase tracking error of less than 0.5 degree was measured, while the maximum amplitude tracking error was less than 0.15 db.

While there have been described what are now thought to be preferred embodiments of the present invention, many modifications and changes will occur to those skilled in the art without departing from the true spirit and scope thereof. For example, coupling transformers need not be used, as the signal can be coupled into the circuit by any of several well known means. Also, various bias arrangements can be employed to suitably bias the transistors. Accordingly, it is not intended to limit the scope of the invention by what has been particularly shown and described except as defined in the appended claims.

What is claimed is:

1. An amplifier circuit comprising, first and second transistors each having an emitter, a collector, and a base, said second transistor being complementary to said first transistor, the collector and emitter of said first transistor being connected to the base and collector, respectively, of said second transistor, high frequency compensating means connected between the emitter of said second transistor and the collector of said first transistor, first and second feedback means coupling the emitter and collector respectively of said second transistor to the base of said first transistor, an input circuit for coupling an input signal to the base of said first transistor, and an output circuit for deriving a signal from the emitter of said second transistor.

2. An amplifier circuit comprising, first and second transistors each having an emitter, a collector, and a base, said second transistor being complementary to said first transistor, the collector and emitter of said first transistor being connected to the base and collector, respectively, of said second transistor, high frequency compensating means connected between the emitter of said second transistor and the collector of said first transistor, first feedback means coupling the emitter of said second transistor to the base of said first transistor, second feedback means coupling the collector of said second transistor to a source of operating potential, an input circuit for applying a signal to the base of said first transistor, and means for deriving an output signal from the emitter of said second transistor.

3. An amplifier circuit comprising, first and second transistors each having an emitter, a collector, and a base, said second transistor being complementary to said first transistor, the collector and emitter of said first transistor being connected to the base and collector, respectively, of said second transistor, a series resistance-inductance network coupling the emitter of said second transistor to the collector of said first transistor, a series resistance-capacitance network coupling the emitter of said second transistor to the base of said first transistor, a resistor connected between the collector of said second transistor and a source of positive operating potential, a load resistor connected between the emitter of said second transistor and a source of negative operating potential, an input circuit for applying a signal to the base of said first transistor, and means for coupling an output signal from said load resistor.

4. An amplifier circuit comprising, first and second transistors each having a base, an emitter and a collector, said second transistor being complementary to said first transistor, the collector and emitter of said first transistor being directly connected respectively to the base and collector of said second transistor, and a high frequency compensating network connected between the emitter of said second transistor and the collector of said first transistor, and operative to extend the frequency range of the amplifier.

5. An amplifier circuit comprising, first and second transistors each having a base, an emitter and a collector, said second transistor being complementary to said first transistor, the collector and emitter of said first transistor being respectively connected directly to the base and collector of said second transistor, and a series resistance-inductance network connected between the emitter of said second transistor to the collector of said first transistor for providing high frequency compensation.

6. An amplifier circuit comprising, first and second transistors each having an emitter, a collector, and a base, said second transistor being complementary to said first transistor, the collector and emitter of said first transistor being connected to the base and collector, respectively, of said second transistor, a series resistance-inductance network coupling the emitter of said second transistor to the collector of said first transistor, a series resistance-capacitance network coupling the emitter of said second transistor to the base of said first transistor, a resistor connected between the collector of said second transistor and a source of positive opertaing potential, a load resistor connected between the emitter of said second transistor and a source of negative operating potential, an input transformer having a primary and a secondary winding, said primary winding being connected to a source of input signals, said secondary winding being connected between the base of said first transistor and ground, and an output transformer having a primary and a secondary winding, said primary winding being connected across said load resistor.

7. A push-pull amplifier comprising two signal channels each of which includes first and second transistors each having a base, an emitter and a collector, said second transistor being complementary to said first transistor, the collector and emitter of said first transistor being connected respectively to the base and collector of said second transistor, a high frequency compensating network connected between the emitter of said second transistor and the collector of said first transistor, first and second feedback means coupling the emitter and collector respectively of said second transistor to the base of said first transistor; input means for applying a balanced signal to the base of said first transistor in each channel, and means for deriving an output signal from the emitter of each of said second transistors.

References Cited by the Examiner

UNITED STATES PATENTS 2,892,165 6/1959 Lindsay.

OTHER REFERENCES

Stasior: "Use of Complementary Transistors in Switching Circuits," GE Application Note 90.6, May 1962 (13 pages), page 3 relied on.

NATHAN KAUFMAN, *Acting Primary Examiner.*